(12) United States Patent
Yang et al.

(10) Patent No.: US 10,360,830 B2
(45) Date of Patent: Jul. 23, 2019

(54) GIP CIRCUIT AND DRIVING METHOD THEREFOR, AND FLAT PANEL DISPLAY DEVICE

(71) Applicant: KUNSHAN NEW FLAT PANEL DISPLAY TECHNOLOGY CENTER CO., LTD., KunShan, Jiangsu (CN)

(72) Inventors: Nan Yang, Jiangsu (CN); Hui Zhu, Jiangsu (CN); Siming Hu, Jiangsu (CN); Tingting Zhang, Jiangsu (CN); Yanqin Song, Jiangsu (CN)

(73) Assignee: KUNSHAN NEW FLAT PANEL DISPLAY TECHNOLOGY CENTER CO., LTD., Jiangsu (CN)

( * ) Notice: Subject to any disclaimer, the term of this patent is extended or adjusted under 35 U.S.C. 154(b) by 0 days.

(21) Appl. No.: 15/774,727

(22) PCT Filed: Nov. 30, 2016

(86) PCT No.: PCT/CN2016/107829
§ 371 (c)(1),
(2) Date: May 9, 2018

(87) PCT Pub. No.: WO2017/107746
PCT Pub. Date: Jun. 29, 2017

(65) Prior Publication Data
US 2018/0322820 A1 Nov. 8, 2018

(30) Foreign Application Priority Data
Dec. 25, 2015 (CN) .......................... 2015 1 0995512

(51) Int. Cl.
*G09G 3/36* (2006.01)
*G09G 3/20* (2006.01)
*G09G 3/3266* (2016.01)

(52) U.S. Cl.
CPC ............. *G09G 3/20* (2013.01); *G09G 3/3266* (2013.01); *G09G 3/3677* (2013.01);
(Continued)

(58) Field of Classification Search
CPC ...... G09G 3/20; G09G 3/3266; G09G 3/3674; G09G 3/3677; G09G 2300/0408;
(Continued)

(56) References Cited

U.S. PATENT DOCUMENTS 8,866,859 B2 * 10/2014 Chung ................. G09G 3/3266
345/690
9,786,228 B2 * 10/2017 Ma ....................... G09G 3/3266
(Continued)

FOREIGN PATENT DOCUMENTS

CN 104183219 A 12/2014
CN 104485065 A 4/2015
(Continued)

*Primary Examiner* — Patrick O Neill
(74) *Attorney, Agent, or Firm* — Muncy, Geissler, Olds & Lowe, P.C.

(57) ABSTRACT

A GIP circuit, a method for driving the GIP circuit and a flat panel display device incorporating the GIP circuit. The GIP circuit is simple in structure and is capable of producing GIP signals that can be neatly pulled from a high level down to a low level. This allows better driving, avoids ripples and achieves higher display quality of the flat panel display device.

10 Claims, 4 Drawing Sheets

(52) U.S. Cl.
CPC ............... *G09G 2300/0408* (2013.01); *G09G 2310/0267* (2013.01); *G09G 2310/0286* (2013.01); *G09G 2310/08* (2013.01)

(58) Field of Classification Search
CPC ... G09G 2310/0267; G09G 2310/0286; G09G 2310/08; G11C 19/28
See application file for complete search history.

(56) References Cited

U.S. PATENT DOCUMENTS

| | | |
|---|---|---|
| 10,013,919 B2 * | 7/2018 | Yang .................... G09G 3/3266 |
| 2012/0105423 A1 | 5/2012 | Chung |
| 2012/0176417 A1 | 7/2012 | Jang et al. |
| 2014/0055444 A1 | 2/2014 | Jang |
| 2015/0358018 A1 | 12/2015 | Kim et al. |
| 2017/0200419 A1 | 7/2017 | Ma |
| 2017/0330633 A1 | 11/2017 | Sun et al. |

FOREIGN PATENT DOCUMENTS

| | | |
|---|---|---|
| CN | 104751769 A | 7/2015 |
| CN | 104835450 A | 8/2015 |
| CN | 104835531 A | 8/2015 |
| CN | 105609022 A | 5/2016 |
| JP | H09269511 A | 10/1997 |
| JP | 2013211088 A | 10/2013 |
| JP | 2014041337 A | 3/2014 |
| KR | 20070030527 A | 3/2007 |
| TW | 201409458 A | 3/2014 |
| TW | 201501102 A | 1/2015 |

* cited by examiner

GIP CIRCUIT AND DRIVING METHOD THEREFOR, AND FLAT PANEL DISPLAY DEVICE

TECHNICAL FIELD

The present invention relates to the field of flat panel displays and, in particular, to a gate-in-panel (GIP) circuit, a method for driving the GIP circuit and a flat panel display device.

BACKGROUND

Rapid development and application of the information technology, wireless mobile communications and information appliances in recent years have been increasing our dependence on electronics and have brought about prosperity for various display technologies and devices. Flat panel display devices are finding extensive use for their complete flatness, lightweight, slimness, higher energy efficiency and other advantages.

At present, in order to reduce the manufacturing cost of flat panel display devices and allow narrow bezels thereof, the gate-in-panel (GIP) technology is usually used to directly integrate gate drive circuits (i.e., GIP circuits) into flat display panels. Such a gate drive circuit includes multiple drive units for generating GIP signals at multiple levels.

Figure 1:
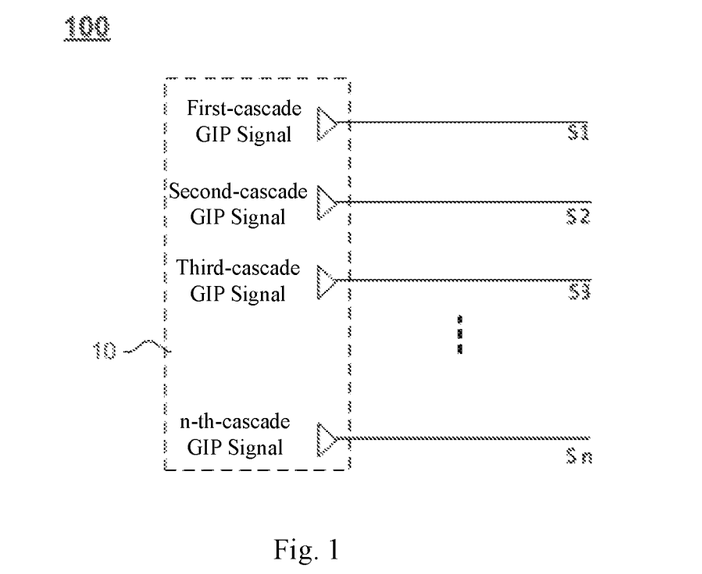
FIG. 1 is a partial schematic view of a conventional flat panel display.

Referring to FIG. 1, a partial view of a conventional flat panel display is illustrated. As shown in FIG. 1, this conventional flat panel display 100 includes a plurality of pixels arranged in a matrix (not shown), a plurality of scan lines (S1 to Sn) and a GIP circuit 10 comprising a plurality of cascaded drive units (not shown) for respectively generating and outputting GIP signals, wherein the GIP signals include a first-cascade GIP signal provided to the scan line for pixels in the first row, a second-cascade GIP signal provided to the scan line for pixels in the second row, . . . , and an n-th-cascade GIP signal provided to the scan line for pixels in the n-th row.

The pixels in the flat panel display 100 are gated based on the associated GIP signals in the scan lines, and correctness of the different GIP signals has a direct impact on the display quality of the flat panel display. Once a GIP signal from a certain cascade is incorrect, the corresponding pixels cannot be gated, leading to display anomalies on a display screen of the flat panel display 100 such as operation failure of the screen, incorrect display in a strip across the screen, or abnormal display of images subsequent to correct display of them.

However, the drive units in the conventional GIP circuit 10 are usually circuits of a so-called 10T3C structure which is complex and incorporates a relatively large number of thin-film transistors (TFTs). Additionally, the GIP signals generated by the drive units cannot be neatly pulled down from a high level to a low level.

Figure 2:
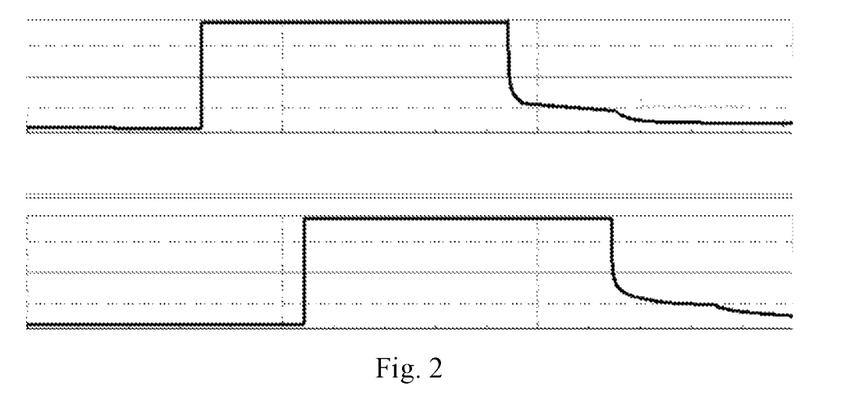
FIG. 2 is a diagram showing simulated conventional GIP signals.

Reference is now made to FIG. 2, a diagram showing simulated conventional GIP signals. As shown in the figure, a GIP signal from a certain cascade, after being raised to the high level, is pulled down to the low level but not neatly pulled down, and a GIP signal from the next cascade is also not neatly pulled down to the low level from the high level. This may cause ripples which are detrimental to the display quality of the flat panel display device.

Therefore, there is a need in the art for a GIP circuit that is simple in structure and can produce GIP signals able to be neatly pulled down from the high level to the low level.

SUMMARY OF THE INVENTION

It is an objective of the present invention to propose such a GIP circuit that is simple in structure and can produce GIP signals able to be neatly pulled down from the high level to the low level, as well as a method for driving the circuit and a flat panel display device.

To solve the above technical problem, the present invention provides a GIP (Gate in Panel) circuit that includes a plurality of sequentially connected drive units, each drive unit connecting to a drive control line, a first gate line, a second gate line, a first clock signal line and a second clock signal line.

The drive unit includes first to eighth transistors, a first capacitor and a second capacitor. The first transistor is connected between the drive control line and a first node and has a gate in connection with the first clock signal line. The second transistor is connected between the first clock signal line and a third node and has a gate in connection with the first node. The third transistor is connected between the second clock signal line and a fourth node and has a gate in connection with the third node. The fourth transistor is connected between a second node and the fourth node and has a gate in connection with the second clock signal line. The fifth transistor is connected between the third node and the second gate line and has a gate in connection with the first clock signal line. The sixth transistor is connected between the first gate line and the second node and has a gate in connection with the first node. The seventh transistor is connected between the first gate line and an output terminal and has a gate in connection with the second node. The eighth transistor is connected between the second gate line and the output terminal and has a gate in connection with the first node. The first capacitor is connected between the third node and the fourth node, and the second capacitor is connected between the first node and the output terminal.

Optionally, in the GIP circuit, each of the first to eighth transistors may be a P-type thin-film transistors.

Optionally, in the GIP circuit, each of the first transistor and the fifth transistor may be turned on or cut off under control of a first clock signal from the first clock signal line, with the fourth transistor turned on or cut off under control of a second clock signal from the second clock signal line, the second transistor and the sixth transistor each turned on or cut off under control of an electric potential at the first node, and the third transistor turned on or cut off under control of an electric potential at the third node.

Optionally, in the GIP circuit, the eighth transistor may be turned on or cut off under control of an electric potential at the first node, with the seventh transistor turned on or cut off under control of an electric potential at the second node.

Optionally, in the GIP circuit, a signal provided by the first gate line may be of a high level, with a signal provided by the second gate line being of a low level.

Accordingly, the present invention also provides a method for driving the GIP circuit as defined above. The method includes a periodic scan over a first time interval, a second time interval, a third time interval, a fourth time interval and a fifth time interval.

In a first time interval, the first clock signal from the first clock signal line drops from a high level to a low level, and the second clock signal from the second clock signal line is at the high level. The drive control line provides a control signal at a high level, and an electric potential of the first node transitions from a low level to a high level. An electric potential of the second node is maintained at a high level, and the seventh transistor and the eighth transistor are turned off. As a result, an output of the output terminal is of a low level.

In a second time interval, the first clock signal from the first clock signal line is of the high level, and the second clock signal from the second clock signal line drops from the high level to a low level. The control signal provided by the drive control line is maintained at the high level, and the electric potential of the first node is maintained at the high level. The electric potential of the second node drops from the high level to a low level and the seventh transistor is turned on. As a result, the output from the output of the output terminal is of a high level.

In a third time interval, the first clock signal from the first clock signal line drops from the high level to the low level, and the second clock signal from the second clock signal line is of the high level. The control signal provided by the drive control line is maintained at the high level, and the electric potential of the first node is pulled up to a higher level. The electric potential of the second node is maintained at the low level. As a result, the output of the output terminal is maintained at the high level.

In a fourth time interval, the first clock signal from the first clock signal line is of the high level, and the second clock signal from the second clock signal line drops from the high level to the low level. The control signal provided by the drive control line drops from the high level to a low level, and the electric potential of the first node is maintained at the high level. The electric potential of the second node is maintained at the low level. As a result, the output of the output terminal is of the high level.

In a fifth time interval, the first clock signal from the first clock signal line drops from the high level to the low level, and the second clock signal from the second clock signal line is of the high level. The control signal provided by the drive control line is maintained at the low level, and the electric potential of the first node drops from the high level to the low level. The electric potential of the second node shifts from the low level to the high level and the eighth transistor is turned on. As a result, the output of the output terminal is of the low level.

Optionally, in the method for driving the GIP circuit, a signal provided by the first gate line may be maintained at a high level, and a signal provided by the second gate line is maintained at a low level, throughout the first, second, third, fourth and fifth time intervals.

Accordingly, the present invention also provides a flat panel display device incorporating the GIP circuit as defined above.

Optionally, the GIP circuit may be disposed in a non-display area of the flat panel display device.

Optionally, the flat panel display device may be an organic light-emitting display device, a liquid crystal display device, a plasma display panel (PDP) device, a vacuum fluorescent display device or a flexible display device.

In summary, the proposed GIP circuit, driving method and flat panel display adopt a novel GIP circuit which is simple in structure and can produce GIP signals able to be neatly and completely pulled down from the high level to the low level such that it allows better driving and can avoid ripple, and the proposed flat panel display device has an improved display quality.

DETAILED DESCRIPTION

The GIP circuit, driving method and flat panel display device proposed in the present invention will be described below in greater detail with reference to particular embodiments which are to be read in conjunction with the accompanying drawings. Features and advantages of the invention will be more apparent from the following detailed description. It is noted that the figures are provided in a very simplified form not necessarily presented to scale, with the only intention to facilitate convenience and clarity in explaining the embodiments.

Figure 3:
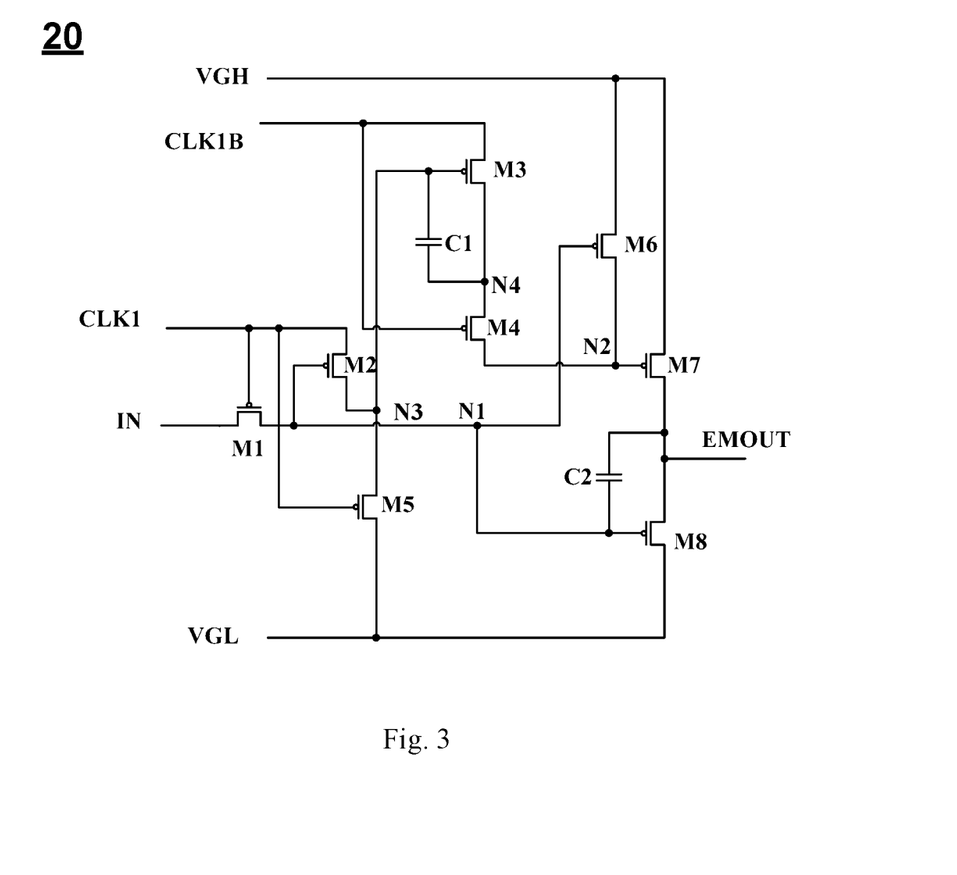
FIG. 3 is a schematic illustration of a GIP circuit according to an embodiment of the present invention.

Referring to FIG. 3, a GIP circuit according to an embodiment of the present invention is schematically illustrated. As shown in FIG. 3, the GIP circuit includes a plurality of cascaded drive units 20, each being connected to a drive control line IN, a first gate line VGH, a second gate line VGL, a first clock signal line CLK1 and a second clock signal line CLK1B and including first to eighth transistors M1-M8, a first capacitor C1 and a second capacitor C2. The first transistor M1 is connected between the drive control line IN and a first node N1, with its gate in connection with the first clock signal line CLK1. The second transistor M2 is connected between the first clock signal line CLK1 and a third node N3, with its gate in connection with the first node N1. The third transistor M3 is connected between the second clock signal line CLK1B and a fourth node N4, with its gate in connection with the third node N3. The fourth transistor M4 is connected between a second node N2 and the fourth node N4, with its gate in connection with the second clock signal line CLK1B. The fifth transistor M5 is connected between the third node N3 and the second gate line VGL, with its gate in connection with the first clock signal line CLK1. The sixth transistor M6 is connected between the first gate line VGH and the second node N2, with its gate in connection with the first node N1. The seventh transistor M7 is connected between the first gate line VGH and an output terminal EMOUT, with its gate in connection with the second node N2. The eighth transistor M8 is connected between the second gate line VGL and the output terminal EMOUT, with its gate in connection with first node N1. The first capacitor C1 is connected between the third node N3 and the fourth node N4, and the second capacitor C2 is connected between the first node N1 and the output terminal EMOUT.

Specifically, the GIP circuit includes a plurality of drive units connected in sequence, such that the output terminal of each drive unit is connected to an input terminal of the immediately downstream drive unit. In other words, the output terminal of each drive unit is connected to the drive control line IN of the immediately downstream drive unit. Each of the drive units is also connected to the first gate line VGH, second gate line VGL, first clock signal line CLK1 and second clock signal line CLK1B. The first gate line VGH may provide a signal that is always maintained at a high level, and the second gate line VGL may provide a signal that is always maintained at a low level.

Each of the drive units 20 may be of a 8T2C structure including 8 transistors and 2 capacitors, in which the seventh and eighth transistors M7, M8 serve as drive transistors and are connected between the first gate line VGH and the second gate line VGL. Additionally, the output terminal EMOUT of the drive unit may be disposed between the seventh and eighth transistors M7, M8, and the first to sixth transistors M1-M6 may all function as switching transistors.

In this embodiment, the first to eighth transistors M1-M8 may all be P-type thin-film transistors.

With continued reference to FIG. 3, the first and fifth transistors M1 and M5 may be turned on or cut off under the control of a first clock signal from the first clock signal line CLK1, while the fourth transistor M4 may be turned on or cut off under the control of a second clock signal from the second clock signal line CLK1B. Additionally, each of the second, sixth and eighth transistors M2, M6, M8 may be turned on or cut off under the control of a level at the first node N1, and the third transistor M3 may be turned on or cut off under the control of a level at the third node N3. Further, the seventh transistor M7 may be turned on or cut off under the control of a level at second node N2.

Compared with the conventional circuit, the 8T2C structure (including 8 transistors and 2 capacitors) of the drive units 20 in the GIP circuit is simpler because it employs fewer transistors and capacitors. In addition, the drive units are capable of producing GIP signals that can be neatly pulled down from the high level to the low level, enabling more powerful, better driving of the circuit.

Figure 4:
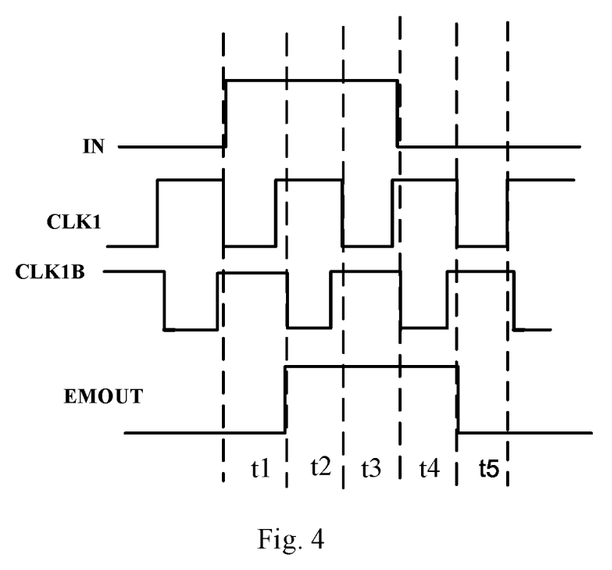
FIG. 4 shows a timing diagram of waveforms in a method for driving the GIP circuit in accordance with an embodiment of the present invention.

Accordingly, the present invention also provides a method for driving the GIP circuit. With reference to FIGS. 3 and 4, the method includes performing periodic scans each divided into a first time interval t1, a second time interval t2, a third time interval t3, a fourth time interval t4 and a fifth time interval t5.

In the first time interval t1, the first clock signal from the first clock signal line CLK1 drops from the high level to the low level, and the second clock signal from the second clock signal line CLK1B is at the high level. Additionally, the drive control line IN provides a control signal at the high level, and the first node N1 jumps from the low level to the high level. Further, the second node N2 is maintained at the high level, and the seventh and eighth transistors M7, M8 are turned off. As a result, the output terminal EMOUT delivers an output at the low level.

In the second time interval t2, the first clock signal from the first clock signal line CLK1 is at the high level, and the second clock signal from the second clock signal line CLK1B drops from the high level to the low level. Additionally, the control signal provided by the drive control line IN is maintained at the high level, and the first node N1 is also maintained at the high level. Further, the second node N2 drops from the high level to the low level, and the seventh transistor M7 is turned on. As a result, the output from the output terminal EMOUT transitions to the high level. Although the first clock signal from the first clock signal line CLK1 is shown in FIG. 4 as transitioning from the low level to the high level at the end of the first time interval t1, the present invention is not so limited, because the transition from the low level to the high level may also occur at the beginning of the second time interval t2, as long as the first clock signal is maintained at the high level throughout the second time interval t2.

In the third time interval t3, the first clock signal from the first clock signal line CLK1 drops from the high level to the low level, and the second clock signal from the second clock signal line CLK1B is at the high level. Additionally, the control signal provided by the drive control line IN is maintained at the high level, and the level at the first node N1 is also maintained at the high level. Further, the second node N2 is maintained at the low level, maintaining the output from the output terminal EMOUT at the high level. Although the second clock signal from the second clock signal line CLK1B is shown in FIG. 4 as transitioning from the low level to the high level at the end of the second time interval t2, the present invention is not so limited, because the transition from the low level to the high level may also occur at the beginning of the third interval t3, as long as the second clock signal is maintained at the high level throughout the third time interval t3.

In the fourth time interval t4, the first clock signal from the first clock signal line CLK1 is at the high level, and the second clock signal from the second clock signal line CLK1B drops from the high level to the low level. The control signal provided by the drive control line IN transitions from the high level to the low level, and the first node N1 is maintained at the high level. The second node N2 is maintained at the low level, maintaining the output from the output terminal EMOUT at the high level. Although the first clock signal from the first clock signal line CLK1 is shown in FIG. 4 as transitioning from the low level to the high level at the end of the third time interval t3, the present invention is not so limited, because the transition from the low level to the high level may also occur at the beginning of the fourth time interval t4, as long as the first clock signal is maintained at the high level throughout the fourth time interval t4.

In the fifth time interval t5, the first clock signal from the first clock signal line CLK1 drops from the higher level to the low level, and the second clock signal from the second clock signal line CLK1B is at the high level. The control signal provided by the drive control line IN is maintained at the low level, and the first node N1 drops from the high level to the low level. The second node N2 jumps from the low level to the high level, and the eighth transistor M8 is turned on. As a result, the output from the output terminal EMOUT drops to the low level. Although the second clock signal from the second clock signal line CLK1B is shown in FIG. 4 as transitioning from the low level to the high level at the end of the fourth time interval t4, the present invention is not so limited, because the transition from the low level to the high level may also occur at the beginning of the fifth interval t5, as long as the second clock signal is maintained at the high level throughout the fifth interval t5.

Specifically, in this method, the first gate line VGH may provide a signal that is always maintained at a high level, and the second gate line VGL may provide a signal that is always maintained at a low level.

In the first time interval t1, in response to the dropping of the first clock signal from the first clock signal line CLK1 from the high level to the low level, the first and fifth transistors M1, M5 that are controlled by the first clock signal are turned on, allowing the control signal provided by the drive control line IN to be transmitted to the first node N1 via the first transistor M1. As a result, the first node N1 is pulled up from the low level to the high level, and the sixth and eighth transistors M6, M8 are therefore cut off. As such, the signal from the second gate line VGL cannot be routed to the output terminal EMOUT via the eighth transistor M8.

Before the sixth transistor M6 is cut off, the signal provided by the first gate line VGH is passed on to the second node N2 via the sixth transistor M6, driving the second node N2 to the high level. Subsequent to the cutoff of the sixth transistor M6, the second node N2 retains the high level and thus causes the cutoff of the seventh transistor M7. As a result, the signal from the first gate line VGH cannot be provided to the output terminal EMOUT via the seventh transistor M7.

At this point, the output terminal EMOUT delivers an output at the low level. At the same time, the signal from the second gate line VGL is provided to the third node N3 via the fifth transistor M5, pulling the third node N3 down to the low level. As a result, the third transistor M3 under the control of the level at the third node N3 is conducted.

In the second time interval t2, in response to the dropping of the second clock signal from the second clock signal line CLK1B from the high level to the low level, the fourth transistor M4 under the control of the second clock signal is turned on. Following this, the second clock signal from the second clock signal line CLK1B is transmitted to the second node N2 via the third and fourth transistors M3, M4, pulling the second node N2 from the high level down to the low level and hence turning the seventh transistor M7 on, through which the signal from the first gate line VGH is routed to the output terminal EMOUT. As a result, the output of the output terminal EMOUT is raised to the high level.

In the third time interval t3, in response to the dropping of the first clock signal from the first clock signal line CLK1 from the high level to the low level, the first and fifth transistors M1 and M5 under the control of the first clock signal are both turned on. The control signal provided by the drive control line IN is again provided to the first node N1 via the first transistor M1, maintaining the first node N1 at the high level and the sixth and eighth transistors M6, M8 in the cutoff state. As a result, the signal from the second gate line VGL cannot be provided to the output terminal EMOUT via the eighth transistor M8, and the second node N2 is maintained at the low level.

Due to the low level at the second node N2, the seventh transistor M7 is turned on to allow the signal from the first gate line VGH to be routed to the output terminal EMOUT via the seventh transistor M7. Therefore, the output from the output terminal EMOUT is maintained at the high level.

At the same time, the signal from the second gate line VGL is again provided to the third node N3 via the fifth transistor M5, pulling the third node N3 down to the low level and hence the third transistor M3 under the control of the level at the third node N3 is turned on.

In the fourth time interval t4, in response to the dropping of the second clock signal from the second clock signal line CLK1B from the high level to the low level, the fourth transistor M4 controlled by the second clock signal is turned on. The second clock signal from the second clock signal line CLK1B is then transferred via the third and fourth transistors M3, M4 to the second node N2, maintaining the second node N2 at the low level and hence turning the seventh transistor M7 on. The signal from the first gate line VGH is thus routed to the output terminal EMOUT via the seventh transistor M7, keeping the output of the output terminal EMOUT at the high level.

In the fifth time interval t5, in response to the dropping of the first clock signal from the first clock signal line CLK1 from the high level to the low level, the first and fifth transistors M1, M5 under the control of the first clock signal are both turned on. The control signal from the drive control line IN is therefore routed to the first node N1 via the first transistor M1, pulling the first node N1 from the high level down to the low level and hence turning the sixth and eighth transistors M6, M8 on. As a result, the signal from the second gate line VGL is transferred to the output terminal EMOUT, causing the output from the output terminal EMOUT to drop to the low level.

At the same time, the signal from the first gate line VGH is provided to the second node N2 via the sixth transistor M6, pulling the second node N2 from the low level up to the high level and hence turning the seventh transistor M7 off. As a result, the signal from the first gate line VGH cannot be provided to the output terminal EMOUT via the seventh transistor M7.

It can be known from the above description that the low-level output of the drive unit 20 is enabled by turning the eighth transistor M8 on to route the low-level signal from the second gate line VGL to the output terminal EMOUT. This allows complete transition from the high level to the low level.

Figure 5:
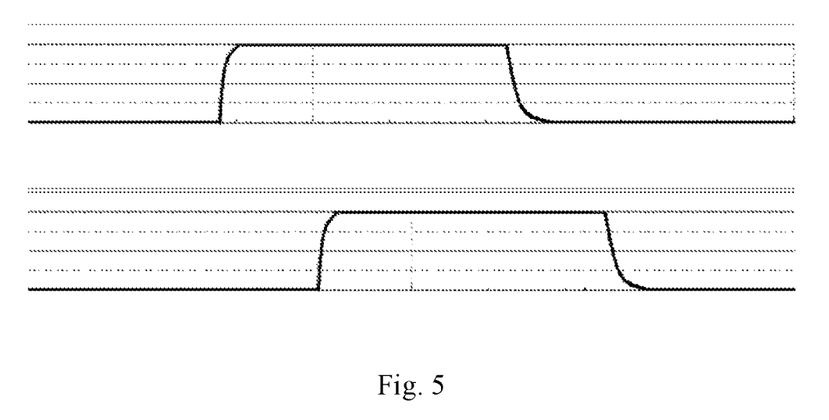
FIG. 5 shows simulated GIP signals according to an embodiment of the present invention.

Reference is now made to FIG. 5, a diagram showing simulated GIP signals according to an embodiment of the present invention. As shown in FIG. 5, after being pulled up to the high level, a GIP signal from a certain cascade is neatly pulled down to the low level, and a GIP signal from the next cascade is also neatly pulled down to the low level from the high level.

Therefore, compared to the conventional GIP circuit and the corresponding driving method, the GIP circuit and method proposed in the present invention allow better driving, avoid ripples and achieve better display quality of a flat panel display device.

Accordingly, the present invention also provides a flat panel display device incorporating the GIP circuit as defined above. Reference can be made to the above description for more details of the device, and a more detailed description of the device is deemed unnecessary herein.

The flat panel display device may generally include a display area and a non-display area surrounding the display area, and the GIP circuit may be generally disposed in the non-display area of the flat panel display device.

The flat panel display device may be a liquid crystal display (LCD) device, a plasma display panel (PDP) device, a vacuum fluorescent display (VFD) device, an organic light-emitting display (OLED) device, a flexible display device or a display device of another type, and the present invention is not limited to any particular type of display device.

In summary, the proposed GIP circuit, driving method and flat panel display adopt a novel GIP circuit which is simple in structure and can produce GIP signals able to be neatly and completely pulled down from the high level to the low level such that it allows better driving and can avoid ripples, and the proposed flat panel display device has an improved display quality.

The preferred embodiments presented above are merely examples and are in no way meant to limit the present invention. Any changes or modifications made by those skilled in the art based on the teachings herein are considered to fall within the scope of the appended claims.

What is claimed is:

1. A GIP (Gate in Panel) circuit, comprising a plurality of sequentially connected drive units, each drive unit connecting to a drive control line, a first gate line, a second gate line, a first clock signal line and a second clock signal line, wherein the drive unit comprises first to eighth transistors, a first capacitor and a second capacitor, the first transistor connected between the drive control line and a first node and having a first gate in connection with the first clock signal line, the second transistor connected between the first clock signal line and a third node and having a second gate in connection with the first node, the third transistor connected between the second clock signal line and a fourth node and having a third gate in connection with the third node, the fourth transistor connected between a second node and the fourth node and having a fourth gate in connection with the second clock signal line, the fifth transistor connected between the third node and the second gate line and having a fifth gate in connection with the first clock signal line, the sixth transistor connected between the first gate line and the second node and having a sixth gate in connection with the first node, the seventh transistor connected between the first gate line and an output terminal and having a seventh gate in connection with the second node, the eighth transistor connected between the second gate line and the output terminal and having an eighth gate in connection with the first node, the first capacitor connected between the third node and the fourth node, the second capacitor connected between the first node and the output terminal.

2. The GIP circuit of claim 1, wherein each of the first to eighth transistors is a P-type thin-film transistor.

3. The GIP circuit of claim 1, wherein each of the first transistor and the fifth transistor is turned on or cut off under control of a first clock signal from the first clock signal line, wherein the fourth transistor is turned on or cut off under control of a second clock signal from the second clock signal line, wherein each of the second transistor and the sixth transistor is turned on or cut off under control of an electric potential at the first node, and wherein the third transistor is turned on or cut off under control of an electric potential at the third node.

4. The GIP circuit of claim 1, wherein the eighth transistor is turned on or cut off under control of an electric potential at the first node, and wherein the seventh transistor is turned on or cut off under control of an electric potential at the second node.

5. The GIP circuit of claim 1, wherein a signal provided by the first gate line is of a high level, and wherein a signal provided by the second gate line is of a low level.

6. A method for driving the GIP circuit as defined in claim 1, comprising:
   in a first time interval, the first clock signal from the first clock signal line drops from a high level to a low level, with the second clock signal from the second clock signal line being at a high level, the drive control line providing a control signal at a high level, an electric potential of the first node transitioning from a low level to a high level, an electric potential of the second node being maintained at a high level, the seventh transistor and the eighth transistor being turned off, to make an output of the output terminal be of a low level;
   in a second time interval, the first clock signal from the first clock signal line is of the high level, with the second clock signal from the second clock signal line dropping from the high level to a low level, the control signal provided by the drive control line being maintained at the high level, the electric potential of the first node being maintained at the high level, the electric potential of the second node dropping from the high level to a low level, the seventh transistor being turned on, to make an output of the output terminal be of a high level;
   in a third time interval, the first clock signal from the first clock signal line drops from the high level to the low level, with the second clock signal from the second clock signal line being of the high level, the control signal provided by the drive control line being maintained at the high level, the electric potential of the first node being pulled up to a higher level, the electric potential of the second node being maintained at the low level, to make the output of the output terminal be maintained at the high level;
   in a fourth time interval, the first clock signal from the first clock signal line is of the high level, with the second clock signal from the second clock signal line dropping from the high level to the low level, the control signal provided by the drive control line dropping from the high level to a low level, the electric potential of the first node being maintained at the high level, the electric potential of the second node being maintained at the low level, to make the output of the output terminal be maintained at the high level; and
   in a fifth time interval, the first clock signal from the first clock signal line drops from the high level to the low level, with the second clock signal from the second clock signal line being of the high level, the control signal provided by the drive control line being maintained at the low level, the electric potential of the first node dropping from the high level to the low level, the electric potential of the second node shifting from the low level to the high level, the eighth transistor being turned on, to make the output of the output terminal be of the low level.

7. The method for driving the GIP circuit of claim 6, wherein a signal provided by the first gate line is maintained at a high level and a signal provided by the second gate line is maintained at a low level throughout the first, second, third, fourth and fifth time intervals.

8. A flat panel display device comprising the GIP circuit as defined in claim 1.

9. The flat panel display device of claim 8, wherein the GIP circuit is disposed in a non-display area of the flat panel display device.

10. The flat panel display device of claim 8, wherein the flat panel display device is an organic light-emitting display device, a liquid crystal display device, a plasma display panel device, a vacuum fluorescent display device or a flexible display device.

\* \* \* \* \*